(12) United States Patent
Brovald et al.

(10) Patent No.: US 7,505,286 B2
(45) Date of Patent: Mar. 17, 2009

(54) PRINTED CIRCUIT BOARD ASSEMBLY RETENTION AND SUPPORT DEVICE

(75) Inventors: Russell K. Brovald, Mountain View, CA (US); Brett C. Ong, San Jose, CA (US); Hyun Soo Kim, Seoul (KR)

(73) Assignee: Sun Microsystems, Inc., Santa Clara, CA (US)

( * ) Notice: Subject to any disclaimer, the term of this patent is extended or adjusted under 35 U.S.C. 154(b) by 1011 days.

(21) Appl. No.: 10/448,252

(22) Filed: May 29, 2003

(65) Prior Publication Data

US 2004/0242078 A1    Dec. 2, 2004

(51) Int. Cl.
*H05K 7/12*    (2006.01)
(52) U.S. Cl. .................. 361/804; 361/742; 361/758; 361/770; 361/807; 361/809; 174/138 G; 174/138 E; 439/328
(58) Field of Classification Search ................ 361/742, 361/770, 758, 804, 807, 809; 174/138 G, 174/138 E; 439/328
See application file for complete search history.

(56) References Cited

U.S. PATENT DOCUMENTS

| 5,117,330 | A | * | 5/1992 | Miazga ....................... 361/760 |
| 5,199,896 | A | * | 4/1993 | Mosquera ................... 439/329 |
| 5,452,184 | A | * | 9/1995 | Scholder et al. ............. 361/799 |
| 5,705,244 | A | * | 1/1998 | Lee ............................ 428/40.1 |
| 6,327,160 | B1 | * | 12/2001 | Liao ........................... 361/809 |
| 6,424,540 | B1 | * | 7/2002 | Chen et al. .................. 361/759 |
| 6,486,406 | B1 | * | 11/2002 | Greco et al. ............. 174/138 R |
| 6,625,041 | B1 | * | 9/2003 | Chen .......................... 361/829 |
| 6,693,799 | B2 | | 2/2004 | Gough et al. |

* cited by examiner

*Primary Examiner*—Dameon E Levi
(74) *Attorney, Agent, or Firm*—Meyertons Hood Kivlin Kowert & Goetzel, P.C.; Jeffrey C. Hood; Gareth M. Sampson

(57) ABSTRACT

A device for coupling a printed circuit board assembly to a computer chassis is described. The device may include a base. The device may include at least two posts. The posts may be located on opposite sides of the base. The posts may couple the device to the computer chassis. The device may include at least one prong. The prong may extend upward from the base. The prong may couple the device to the printed circuit board assembly.

38 Claims, 2 Drawing Sheets

PRINTED CIRCUIT BOARD ASSEMBLY RETENTION AND SUPPORT DEVICE

BACKGROUND

1. Field of the Invention

This invention generally relates to the field of coupling printed circuit board assemblies (e.g., motherboard assemblies) to a computer chassis. Certain embodiments relate to a device used for coupling a printed circuit board assembly to a computer chassis.

2. Description of the Related Art

In general, printed circuit board assemblies (e.g., motherboard assemblies) have been mounted to a computer chassis using screws. The screws are used to directly mount a printed circuit board assembly to the computer chassis. Screws have to be screwed in using a screwdriver or other suitable tool. Using tools in such a small environment can be difficult and time consuming. Additionally, losing screws during installation is a common occurrence. In some cases, screws may become loose after installation. Such screws may become lost and/or cause damage or malfunction of the computer apparatus.

A printed circuit board assembly mounted to a computer chassis by screws may undergo flexing and/or other stress that can cause warping and eventual failure of the printed circuit board assembly. For example, warping of the printed circuit board assembly could break circuit lines on the board, which may cause failure of the circuit board. Straining or flexing of the printed circuit board assembly may be caused by cables or other connectors coupled to the assembly putting pressure on the assembly. Removing the straining, flexing, or warping of the printed circuit board assembly may improve the reliability and the lifetime of the printed circuit board assembly.

SUMMARY

In an embodiment, a coupling device for coupling a printed circuit board assembly to a computer chassis includes a base and one or more posts. The posts may be located on opposite sides of the base. The two posts may be used to couple the coupling device to the computer chassis. The coupling device may include at least one prong. The prong may couple the coupling device to the printed circuit board assembly. In certain embodiments, the prong may include a hook to couple to the printed circuit board assembly.

In some embodiments, the device may include feet that slidably couple to a groove in an opening in the computer chassis. The device may be fixably coupled to the computer chassis at a locked position in the opening in the computer chassis. In open positions, the device may be removed from the opening in the computer chassis. Protrusions on the posts of the device may fix a position of the device in the locked position in the opening. The protrusions may couple to notches in the computer chassis.

In certain embodiments, the device may be removably coupled to the printed circuit board assembly and/or the computer chassis. The device may be coupled or uncoupled to the computer chassis and/or the printed circuit board assembly without using tools (e.g., by the hands of a builder, designer, or user of the computer). In an embodiment, the printed circuit board assembly is coupled to the computer chassis using the device such that movement of the printed circuit board assembly in at least three planes is inhibited.

BRIEF DESCRIPTION OF THE DRAWINGS

Advantages of the present invention may become apparent to those skilled in the art with the benefit of the following detailed description and upon reference to the accompanying drawings in which.

Figure 1:
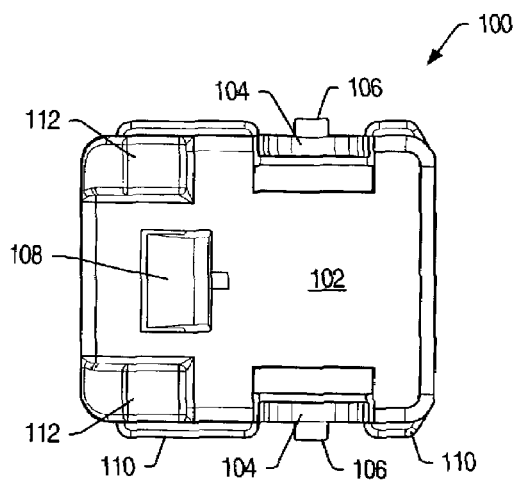
FIG. 1 depicts a top view of an embodiment of a device for coupling a printed circuit board assembly to a computer chassis.

While the invention is susceptible to various modifications and alternative forms, specific embodiments thereof are shown by way of example in the drawings and may herein be described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION

Figure 2:
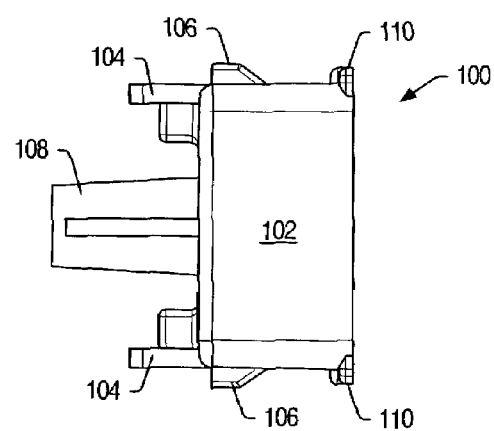
FIG. 2 depicts an end view of an embodiment of a device for coupling a printed circuit board assembly to a computer chassis.
Figure 3:
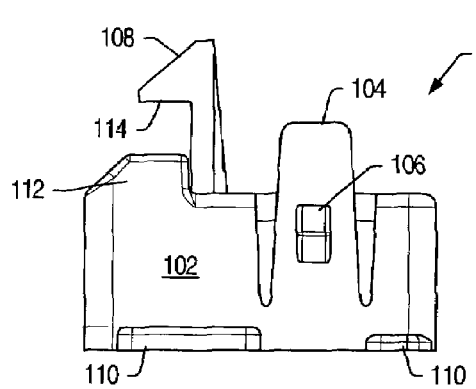
FIG. 3 depicts a side view of an embodiment of a device for coupling a printed circuit board assembly to a computer chassis.
Figure 4:
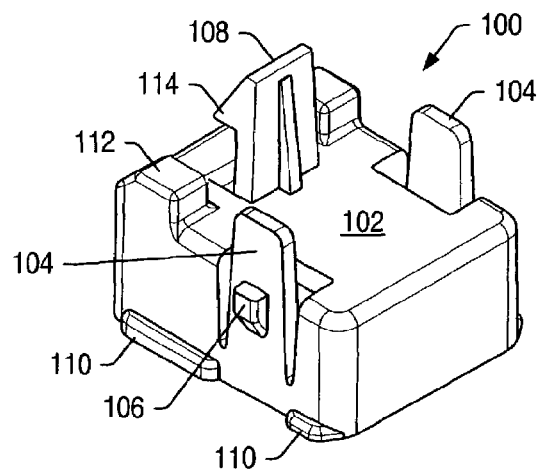
FIG. 4 depicts a perspective view of an embodiment of a device for coupling a printed circuit board assembly to a computer chassis.

FIGS. 1-4 depict several views of an embodiment of device 100 for coupling a printed circuit board assembly to a computer chassis. FIG. 1 depicts a top view of an embodiment of device 100. FIG. 2 depicts an end view of an embodiment of device 100. FIG. 3 depicts a side view of an embodiment of device 100. FIG. 4 depicts a perspective view of an embodiment of device 100.

Device 100 may be made of materials that have excellent mechanical strength and good thermal stability. For example, device 100 may be made of polymers such as, but not limited to, resin polymers, polyethylene, and polyvinyl chloride. In one embodiment, device 100 is made of Starex HF (high flow) ABS available from Cheil Industries (Korea). In an embodiment, device 100 is a unitary device made as a single piece. Device 100 may be a polymer molded into a unitary device. In some embodiments, one or more components included in device 100 may be separate components coupled to the device structure and/or to another component of the device.

Device 100 is not limited to any particular design of a computer chassis or printed circuit board assembly. The dimensions of device 100 may be designed to properly accommodate any desired computer chassis and/or printed circuit board assembly. In addition, structures for coupling device 100 to either a computer chassis or a printed circuit board assembly as described herein may be modified to couple the device to any desired computer chassis or printed circuit board assembly.

Figure 5:
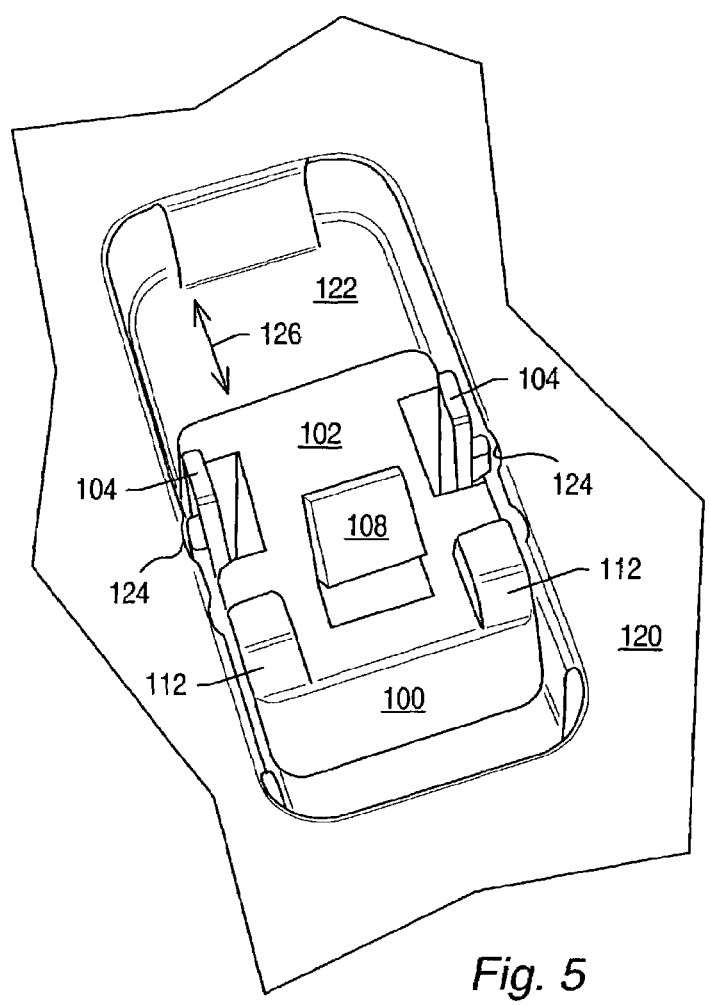
FIG. 5 depicts a perspective view of an embodiment of a device for coupling a printed circuit board assembly to a computer chassis coupled to the computer chassis in a locked position.

FIG. 5 depicts a perspective view of an embodiment of device 100 coupled to computer chassis 120 in a locked position. Chassis 120 may have opening 122 for coupling to device 100. In some embodiments, opening 122 in chassis 120 may be a stamped or pressed opening in the chassis. In an embodiment, device 100 is inserted into opening 122 and is movable along a length of the opening (e.g., back and forth in a direction of arrow 126, as shown in FIG. 5). Device 100 may be fixably coupled to chassis 120 at one or more positions in opening 122. In an embodiment, device 100 is placed into opening 122 and then slidably moved to a locked position in the opening and fixably coupled to chassis 120. Device 100 may be placed in opening 122 and moved into a locked position without using tools (e.g., by the hands of a builder, designer, or user of the computer chassis). Tools used to couple a printed circuit board assembly to a computer chassis may include, for example, screwdrivers, wrenches, and/or hammers.

In certain embodiments, a wall of opening 122 in chassis 120 may include a groove. The groove may have been formed (e.g., stamped) as part of the wall of the opening in the chassis. The groove may control movement of device 100 along a length of opening 122. For example, device 100 may have one or more protrusions or feet that slidably couple to the groove and inhibit up or down movement of the device except at certain open positions along the groove. At the open positions along the groove, device 100 may move up and down in the opening (e.g., be removed from opening 122).

As shown in FIGS. 1-4, device 100 may include base 102. Device 100 may include one or more feet 110. Feet 110 may extend from a bottom of base 102. In certain embodiments, feet 110 may be protrusions extending from the bottom of base 102. Feet 110 may couple (e.g., slidably couple) to a groove in a wall of an opening in a computer chassis. Feet 110 may couple to the groove such that device 100 is removable from the groove (i.e., uncoupled from the computer chassis) at only one or more positions along a length of the groove. Feet 110 may inhibit up and down movement of device 100 in the groove except at the open positions along the groove.

Device 100 may include one or more posts 104. In one embodiment, device 100 includes two posts 104. Other numbers of posts 104 may be used as desired or needed. Posts 104 may be coupled to base 102. In certain embodiments, posts 104 are located on opposite sides of base 102, as shown in FIGS. 1-4. In certain embodiments, posts 104 may include one or more protrusions 106. Protrusions 106 may extend outward from base 102. Protrusions 106 may couple to one or more notches 124 in a wall of opening 122, as shown in FIG. 5. In an embodiment, protrusions 106 may slide into notches 124 as device 100 is slid along the groove in a wall of opening 122. Notches 124 may define a locked position of device 100 in opening 122. Coupling of notches 124 and protrusions 106 may inhibit movement of device 100 in a sliding motion (i.e., in the direction of arrow 126) in opening 122. Thus, when device 100 is in a locked position in opening 122, the device is inhibited from any significant motion in at least three planes (e.g., up and down, left and right, and forwards and backwards) in the opening.

In an embodiment, posts 104 may be coupled to base 102 at first ends of the posts, as shown in FIGS. 3 and 4. The second ends and the bodies of posts 104 may be uncoupled from base 102 so that the second ends and bodies (including protrusions 106) of the posts are movable relative to base 102. In certain embodiments, posts 104 may be movable towards a center of base 102 (i.e., press inwards). Moving posts 104 towards the center of base 102 may uncouple protrusions 106 from notches 124. Posts 104 may be movable towards a center of base 102 to uncouple device 100 from a locked position in opening 122 in chassis 120 (e.g., so that the device can be slid to an open position in the opening and removed). Posts 104 may also move inwards during movement of device 100 in opening 122 to allow protrusions 106 to couple to notches 124 and fixably couple the device in a locked position. In certain embodiments, posts 104 may be movable towards the center of base 102 without using tools (e.g., by the hands or fingers of a builder, designer, or user of a computer chassis).

As shown in FIGS. 1-4, device 100 may include at least one prong 108. Prong 108 may extend from an upper surface of base 102. Prong 108 may be used to couple device 100 to a printed circuit board assembly. Prong 108 may include hook 114. Hook 114 may couple to a compatible feature in the printed circuit board assembly (e.g., a latch). Other coupling configurations may also be used to couple device 100 to the printed circuit board assembly (e.g., posts with protrusions similar to posts 104 and protrusions 106). The printed circuit board assembly may be coupled to device 100 using prong 108 such that the printed circuit board assembly is inhibited from moving relative to the device and, thus, relative to the computer chassis. In some embodiments, base 102 may include protrusions 112. Protrusions 112 may inhibit movement of the printed circuit board assembly when the assembly is coupled to device 100 using prong 108.

Figure 6:
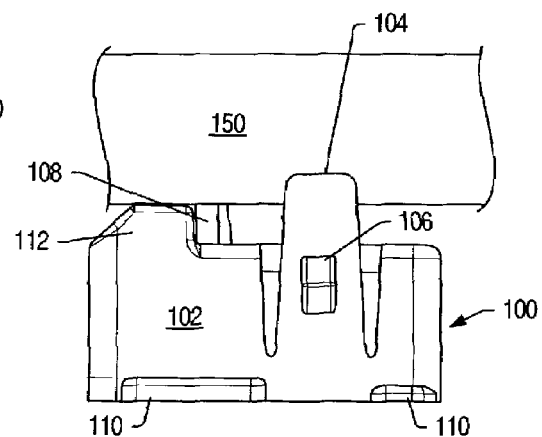
FIG. 6 depicts a side view of an embodiment of a device for coupling a printed circuit board assembly to a computer chassis coupled to the printed circuit board assembly.

FIG. 6 depicts a side view of an embodiment of device coupled to a portion of printed circuit board assembly 150. In one embodiment, device 100 may be coupled to printed circuit board assembly 150 proximate a center of the printed circuit board assembly. In certain embodiments, device 100 may be coupled to printed circuit board assembly 150 at other positions on the assembly. In some embodiments, more than one device 100 may be used to couple printed circuit board assembly 150 to a computer chassis. For example, four devices 100 may be used with one device coupled proximate each of the four corners of printed circuit board assembly 150.

In certain embodiments, printed circuit board assembly 150 may be removably coupled to device 100. For example, prong 108 (as shown in FIGS. 1-4) may be flexible or movable to uncouple the printed circuit board assembly from device 100 (e.g., unhook hook 114 from a latch). In certain embodiments, the printed circuit board assembly may be coupled and uncoupled to device 100 without using tools. For example, prong 108 may be moved by hands or fingers of a builder, designer, or user to couple or uncouple the printed circuit board assembly. Being able to couple or uncouple device 100 from the computer chassis and/or the printed circuit board assembly without tools as described herein may save time in coupling the printed circuit board assembly to the computer chassis. Generally, using tools in coupling or uncoupling a printed circuit board assembly to a computer chassis involves time consuming insertion or removal of screws. Device 100 allows coupling or uncoupling of a printed circuit board assembly to a computer chassis in a simple, efficient process.

Device 100 may couple a printed circuit board assembly to a computer chassis such that the printed circuit board assembly is inhibited from significant motion in any of three planes (i.e., up and down, left and right, forwards and backwards). Device 100 may also inhibit straining, flexing, and/or warping of the printed circuit board assembly while it is coupled to the computer chassis. The printed circuit board assembly may be inhibited from straining, flexing, and/or warping because of the coupling connection (i.e., prong 108) between device 100 and the printed circuit board assembly. Prong 108 may provide support for the printed circuit board assembly to inhibit straining, flexing, and/or warping of the printed circuit board assembly. Inhibiting straining, flexing, and/or warping of the printed circuit board assembly may improve the long-term reliability of the printed circuit board assembly and thus, increase the operative lifetime of the printed circuit board assembly.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A device for coupling a printed circuit board assembly to a computer chassis, comprising:
   a base;
   at least two posts located on opposite sides of the base, wherein the at least two posts extend above an upper surface of the base, and wherein the at least two posts couple the device to the computer chassis; and
   at least one prong extending upward from the base, wherein the at least one prong couples the device to the printed circuit board assembly.

2. The device of claim 1, wherein the at least one prong comprises a hook couple to the printed circuit board assembly.

3. The device of claim 1, wherein the base comprises at least two protrusions on an upper surface of the base, and wherein the at least two protrusions inhibit movement of the printed circuit board assembly during use.

4. The device of claim 1, wherein the base comprises one or more feet to slidably couple to a groove in the computer chassis.

5. The device of claim 1, wherein the at least two posts couple to at least two notches in an opening in the chassis.

6. The device of claim 1, wherein the base fixably couples to the chassis in a locked position using the at least two posts.

7. The device of claim 1, wherein the at least two posts comprise protrusions, and wherein the protrusions slide into at least two notches in the chassis to affix a position of the device in the chassis.

8. The device of claim 1, wherein the at least two posts are movable towards the center of the base.

9. The device of claim 1, wherein the at least two posts can be pushed towards the center of the base by a user.

10. The device of claim 1, wherein the at least two posts are movable towards the center of the base to uncouple the base from the computer chassis.

11. The device of claim 1, wherein the device couples to the printed circuit board assembly proximate the center of the printed circuit board assembly.

12. The device of claim 1, wherein the device couples to the printed circuit board assembly without using tools.

13. The device of claim 1, wherein the device inhibits movement of the printed circuit board assembly in at least three planes after coupling of the printed circuit board assembly to the chassis with the device.

14. The device of claim 1, wherein the device inhibits flexing of the printed circuit board assembly after coupling of the printed circuit board assembly to the chassis with the device.

15. The device of claim 1, wherein the device inhibits warping of the printed circuit board assembly after coupling of the printed circuit board assembly to the chassis with the device.

16. The device of claim 1, wherein the device is removably coupled to the computer chassis.

17. The device of claim 1, wherein the device is removably coupled to the printed circuit board assembly.

18. A system, comprising:
   a computer chassis comprising an opening with a groove in a wall of the opening;
   a device removably coupled to the chassis, wherein the device comprises one or more feet that slidably couple to the groove in the wall of the opening of the computer chassis; and
   a printed circuit board assembly removably coupled to the device.

19. The system of claim 18, wherein the device comprises at least one prong that removably couples the device to the printed circuit board assembly.

20. The system of claim 19, wherein the at least one prong is movable to uncouple the device from the printed circuit board assembly.

21. The system of claim 18, wherein the device comprises at least two protrusions on an upper surface of the device, and wherein the at least two protrusions inhibit movement of the printed circuit board assembly during use.

22. The system of claim 18, wherein the device comprises at least two posts to couple to at least two notches in the opening in the chassis.

23. The system of claim 22, wherein the device is fixably coupled to the chassis in a locked position with the at least two posts.

24. The system of claim 22, wherein the at least two posts comprise protrusions that slide into the at least two notches in the chassis to affix a position of the device in the opening.

25. The system of claim 22, wherein the at least two posts are movable towards the center of the device.

26. The system of claim 22, wherein the at least two posts are movable towards the center of the device to uncouple the device from the computer chassis.

27. The system of claim 18, wherein the device is coupled to the printed circuit board assembly proximate the center of the printed circuit board assembly.

28. The system of claim 18, wherein the device is coupled to the chassis without using tools.

29. The system of claim 18, wherein the device is coupled to the printed circuit board assembly without using tools.

30. The system of claim 18, wherein the device inhibits movement of the printed circuit board assembly in at least three planes during use.

31. The system of claim 18, wherein the device inhibits flexing of the printed circuit board assembly during use.

32. The system of claim 18, wherein the device inhibits warping of the printed circuit board assembly during use.

33. A method for coupling a printed circuit board assembly to a computer chassis, comprising:
   coupling a device to a groove in a wall of an opening in the computer chassis, wherein the device comprises one or more feet that slidably couple to the groove in the wall of the opening of the computer chassis, wherein the device comprises at least two posts located on opposite sides of the device, and wherein the device is coupled to the computer chassis using the posts; and coupling the printed circuit board assembly to the device using at least one prong extending upwardly from the device such that the printed circuit board assembly is coupled to the computer chassis.

34. The method of claim 33, wherein the device is coupled to the computer chassis in a locked position to inhibit movement of the device in at least three planes.

35. The method of claim 33, further comprising sliding the device in the opening such that protrusions on the at least two posts slide into at least two notches in the chassis and affix a position of the device in the opening.

36. The method of claim 33, wherein the printed circuit board assembly is removably coupled to the computer chassis.

37. The method of claim 33, further comprising coupling the printed circuit board assembly to the computer chassis without using tools.

38. The method of claim 33, further comprising coupling the printed circuit board assembly to the computer chassis such that the printed circuit board assembly is inhibited from flexing.

* * * * *